US009551766B2

(12) United States Patent
Kayani

(10) Patent No.: US 9,551,766 B2
(45) Date of Patent: *Jan. 24, 2017

(54) MAGNETORESISTIVE DETECTION SYSTEM AND METHOD FOR DETECTION OF MAGNETIC IMAGE OF BANK NOTES

(71) Applicant: Toshiba International Corporation, Houston, TX (US)

(72) Inventor: Sohail Kayani, Irving, TX (US)

(73) Assignee: Toshiba International Corporation, Houston, TX (US)

(*) Notice: Subject to any disclaimer, the term of this patent is extended or adjusted under 35 U.S.C. 154(b) by 269 days.

This patent is subject to a terminal disclaimer.

(21) Appl. No.: 14/253,143

(22) Filed: Apr. 15, 2014

(65) Prior Publication Data

US 2014/0224877 A1   Aug. 14, 2014

Related U.S. Application Data

(63) Continuation of application No. 13/627,797, filed on Sep. 26, 2012, now Pat. No. 8,733,654, which is a continuation of application No. 12/556,360, filed on Sep. 9, 2009, now Pat. No. 8,297,507.

(60) Provisional application No. 61/096,219, filed on Sep. 11, 2008.

(51) Int. Cl.
*G06K 7/08* (2006.01)
*G01R 33/09* (2006.01)
*G07D 7/04* (2016.01)
*G07D 7/20* (2016.01)

(52) U.S. Cl.
CPC .............. *G01R 33/091* (2013.01); *G06K 7/087* (2013.01); *G07D 7/04* (2013.01); *G07D 7/2025* (2013.01); *G07D 7/2058* (2013.01)

(58) Field of Classification Search
CPC ......... G06K 7/084; G06K 7/088; G07F 19/20; G06Q 20/1085
USPC .................................................. 235/449, 379
See application file for complete search history.

(56) References Cited

U.S. PATENT DOCUMENTS

| 5,155,643 A | 10/1992 | Jones, Jr. et al. |
| 8,297,507 B2* | 10/2012 | Kayani .......................... 235/449 |
| 2002/0066125 A1 | 5/2002 | Mukai |
| 2004/0255354 A1 | 12/2004 | Graef et al. |
| 2007/0000750 A1 | 1/2007 | Uno et al. |

* cited by examiner

*Primary Examiner* — Karl D Frech
(74) *Attorney, Agent, or Firm* — Baker Botts L.L.P.

(57) ABSTRACT

A system and method for obtaining a fill image of a bank note being processed. At least one magnetoresistive detector is employed to obtain line-scan sensings of a bank note as the note passes. A central processing unit obtains the sensing as magnetic pattern data which is subsequently stored in a database for processing.

20 Claims, 3 Drawing Sheets

MAGNETORESISTIVE DETECTION SYSTEM AND METHOD FOR DETECTION OF MAGNETIC IMAGE OF BANK NOTES

CROSS-REFERENCE TO RELATED APPLICATIONS

This application is a continuation application from U.S. patent application Ser. No. 13/627,797 filed on Sep. 26, 2012, which is a continuation of U.S. patent application Ser. No. 12/556,360, filed Sep. 9, 2009, issued as U.S. Pat. No. 8,297,507, which claims the benefit of provisional Application No. 61/096,219, filed Sep. 11, 2008.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to automated currency processing and, more specifically, to the automated imaging, through use of magnetoresistive detectors, of bank notes undergoing high-speed processing.

2. Description of Related Art Including Information Disclosed Under 37 CFR 1.97 and 1.98

In an effort to combat the counterfeiting of bank notes and other machine-processable security documents, substrate manufactures continue to develop and incorporate new security features into their product. These security features include the utilization of embedded magnetic strips as well as magnetic inks with which to print the currency on the substrate.

Current bank note processing machines feature numerous detectors and sensors to determine various attributes of a bank note being processed. Such machines often incorporate a magnetoresistive detector that detects the embedded magnetic strip and/or magnetic ink on the face of the bill. However, current magnetoresistive detectors only detect the absence or presence of such features which yields only limited information. What is needed is a magnetoresistive detector that is capable of imaging the entire note such that the note's image may be retained as a record or may be further examined by use of specialized imaging algorithms.

BRIEF SUMMARY OF THE INVENTION

A system for automatically detecting the magnetic features of a bank note, the system comprising: a transport device capable of transporting a bank note along a defined path; a data processing device capable of executing stored program instructions; a data storage device operably coupled with the data processing device; and a first detector device operably coupled with the data processing device, the first detector device comprising a plurality of magnetoresistive sensors positioned proximate the transport device and oriented so as to enable detection of the magnetic features of the adjacent surface of the passing bank note.

A method for detecting the magnetic features of a bank note, the method steps comprising: transporting the bank note along a defined sport path proximate to a first array of magnetoresistive detectors; repeatedly reading the outputs from the first array of magnetoresistive detectors as the note is adjacent thereto to obtain first surface magnetic pattern data of the surface of the passing note adjacent to the detector array; analyzing the first surface magnetic pattern data with a data processing device; and making a determination regarding final processing of the bank note based upon the first surface magnetic pattern data These and other improvements will become apparent when the following detailed disclosure is read in light of the supplied drawings. This summary is not intended to limit the scope of the invention to any particular described embodiment or feature. It is merely intended to briefly describe some of the key features to allow a reader to quickly ascertain the subject matter of this disclosure. The scope of the invention is defined solely by the claims when read in light of the detailed disclosure.

BRIEF DESCRIPTION OF THE SEVERAL VIEWS OF THE DRAWING(S)

The present invention will be more fully understood by reference to the following detailed description of the preferred embodiments of the present invention when read in conjunction with the accompanying drawings, in which like reference numbers refer to like parts throughout the views, wherein.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

DETAILED DESCRIPTION OF THE INVENTION

Typical currency processing machines comprise a bank note feeder device, a transport device or belt along which notes travel past several detectors, and a final disposition component, which comprises typically a pocket for collection of processed notes, a strapper for strapping the notes in bundles, and a means for depositing the notes into the pocket by pulling the notes from the note processing path or transport device. As the note is processed, detectors along the transport path scan the note for various attributes.

The present invention utilizes a data processing device capable of running stored program instructions and machine memory capable of storing program instructions. The data processing device may include one or a combination of a general purpose computer, a CISC, RISC, or other embedded controller, a DSP, or even programmable logic devices such as PALs, GALs, CPLDs, FPGAS, and the like. Data storage is provided by onboard semiconductor memory devices such as RAM or ROM ICs, and/or magnetic storage such as hard drive storage devices, magnetic tape storage devices, and the like.

The present invention utilizes a novel method for imaging an entire bank note printed with magnetic ink. Instead of merely providing an indication of the presence or absence of such magnetic ink or embedded strip, the present embodiment creates what is, in essence, a "snapshot" image of the entire note.

Figure 1:
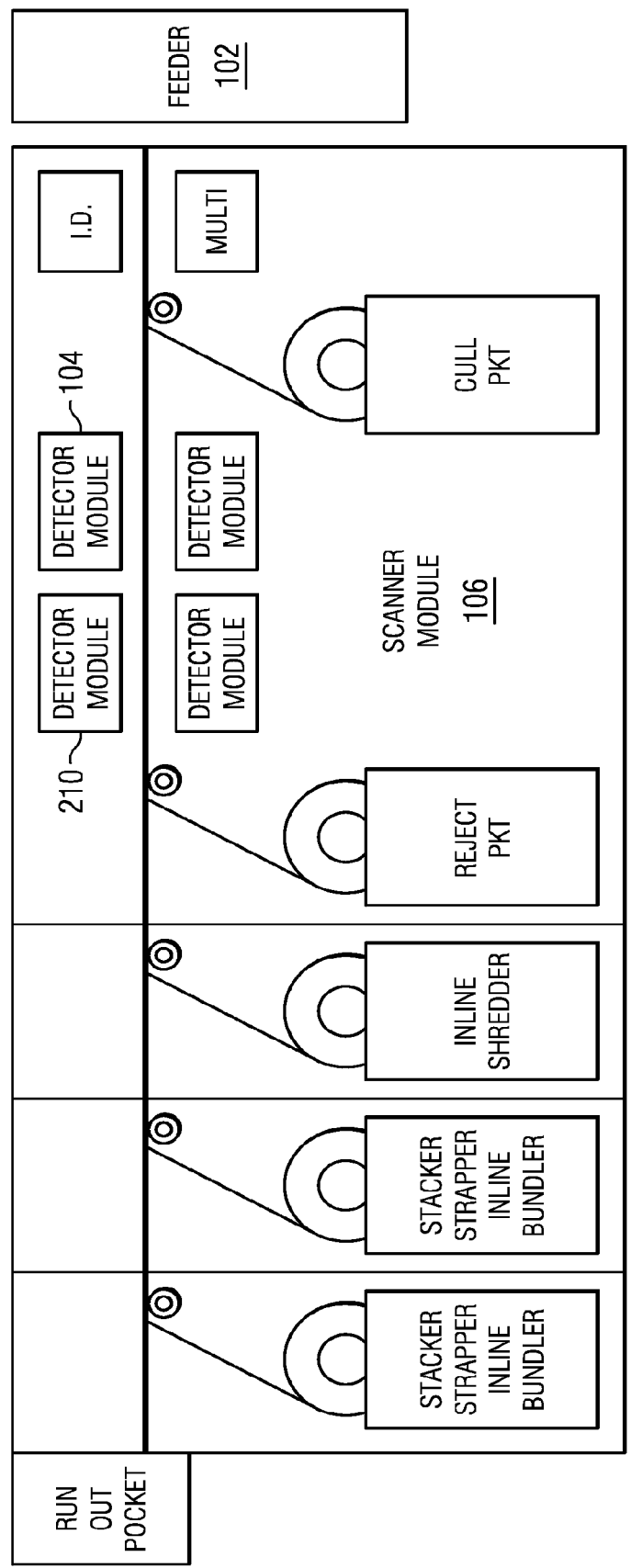
FIG. 1 depicts a block diagram of a basic bank note processing machine, illustrating the location of magnetoresistive detectors within the processing stream.

FIG. 1 depicts a simplified block diagram of a bank note processing machine embodiment, highlighting the relative location of the novel detectors (as claimed herein) with respect to the transport path. The note is propelled into the transport path by the feeder mechanism (102) where it enters the scanner module (106). The scanner transports the note past a magnetoresistive detector device (104) in addition to other detectors (110). The detectors are configured to detect at least one attribute of the note under examination.

Figure 2A:
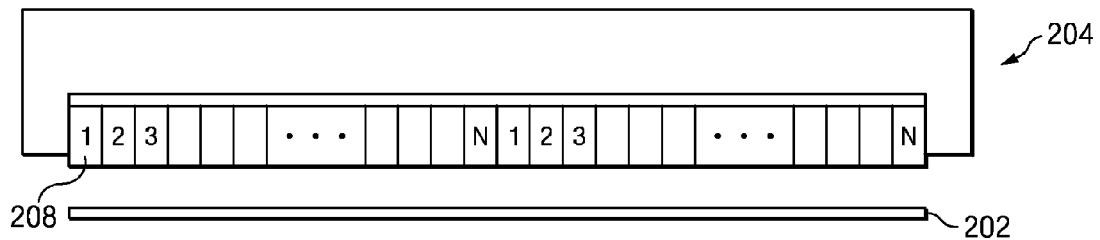
FIG. 2A is an end-on depiction of a magnetoresistive detector device with a bank note passing beneath the sensor surface.
Figure 2B:
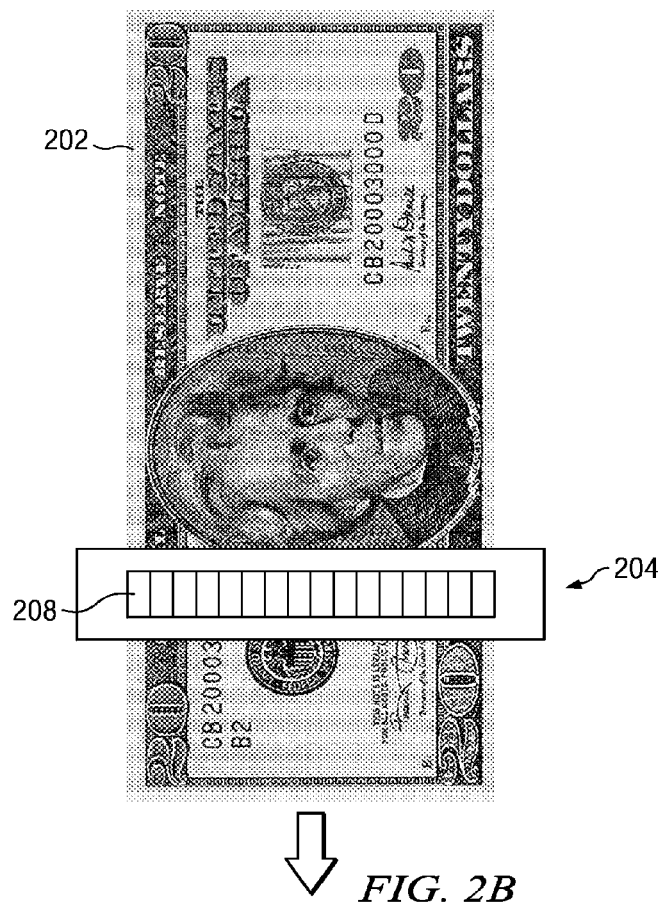
FIG. 2B is a top-down depiction of the magnetoresistive detector device and passing bank note.

FIGS. 2A and 2B depict a more detailed view of the magnetoresistive detector ("MRD") device. As depicted in FIG. 2A, the MRD of the present invention is configured with two 8-channel arrays of magnetoresistive sensors. By combining multiple arrays into a tightly packed device, multiple sensings of a note may occur which provides a higher resolution output. Although this embodiment utilizes an 8-channel array, one of ordinary skill in the art will appreciate that a greater or lesser number of sensors may be utilized without straying from the scope of the invention herein.

FIG. 2A shows an end-on view of the bank note (202) as it passes the MRD device. The MRD consists of a sensor enclosure (204), which houses the magnetoresistive sensor array (208). The sensor array (208) spans the width of the bank note and is located sufficiently close to the bank note to enable detection of the note's magnetic features.

Although the present embodiment utilizes an array that spans the width of the bank note, it is possible to use other arrays that may span only a portion of the bank note. For example, it is possible to utilize two six-channel array devices that each only cover three-fourths of the width of the bank note by staggering the two arrays such that one covers from the left side of the bank note and the other covers from the right side of the bank note. The stagger will result in a magnetic pattern data mismatch and overlap that can be removed through subsequent processing by the data processor.

FIG. 2C depicts a top-down view of the bank note (202) passing through the detector (104). As the note (202) moves linearly past the magnetoresistive sensor array (208), the data processing circuitry obtains repeated readings from the array (208). The array (208) senses magnetic fluctuations caused by the various features of the note (202), such as the magnetic ink used in printing and the embedded magnetic stripes and other such elements. As it is obtained, the magnetic pattern data is stored in the data storage device for subsequent processing. Image processing algorithms may then be applied to the sensed data to reconstruct the note. In the top-down view, only the first MRD device (204) is visible. In an embodiment having two MRD devices, the second MRD device (not shown) would be mounted somewhere beneath the first MRD device (204) on the opposite side of the bank note transport path.

Figure 4:
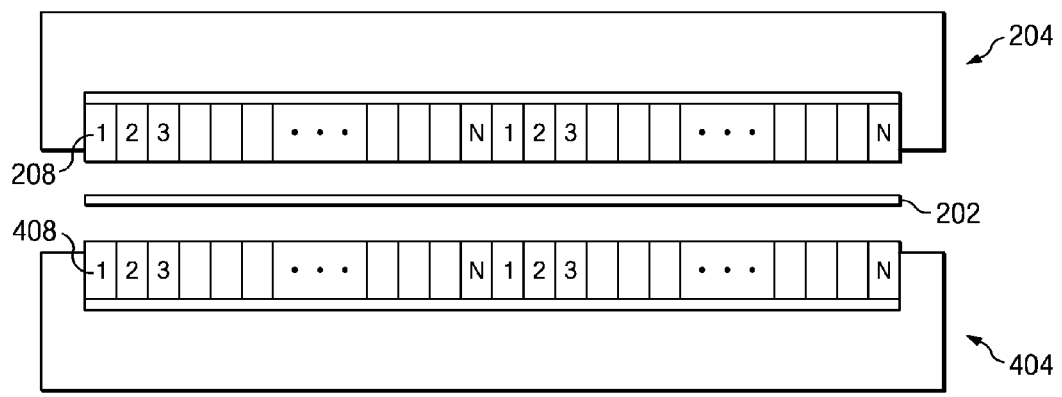
FIG. 4 is an end-on depiction of a two-detector magnetoresistive detector device with a bank note passing between the two detectors.

FIG. 4 depicts an embodiment of the present invention that utilizes two MRD devices (204 and 404), each configured and positioned along the bank note transport path to detect one surface of the passing bank note (202). As shown, the top MRD (204) and the bottom MRD (404) (or the first and second MRDs, respectively) utilize a similar magnetoresistive sensor array configuration (208 and 408). This allows the embodiment to obtain magnetic pattern data from both sides of the bank note as the note passes. It is also possible to utilize a first MRD device of one resolution (such as an 8-channel array) with a second MRD device of another resolution (such as a 4-channel array) if such arrangement yields sufficient first and second surface magnetic pattern data to satisfy the objectives of the operator. For example, the operator may need a representative digital image of the front surface of the bank note (which can be provided by the higher-resolution MRD device) and only an indication of the magnetic features of the back surface of the bank note (which can be provided by the lower-resolution MRD device). Such combinations are clearly within the scope of the invention as claimed.

Although a configuration using two 8-channel arrays is described herein, it is possible to use a single 16-channel or larger array as well or some similar combination of MRDs. One of ordinary skill in the art will appreciate that the higher the channel density (and lower the detection width of the channel) that is utilized to obtain the magnetic pattern data, the greater the resolution of the magnetic pattern data that may be obtained.

Figure 3:
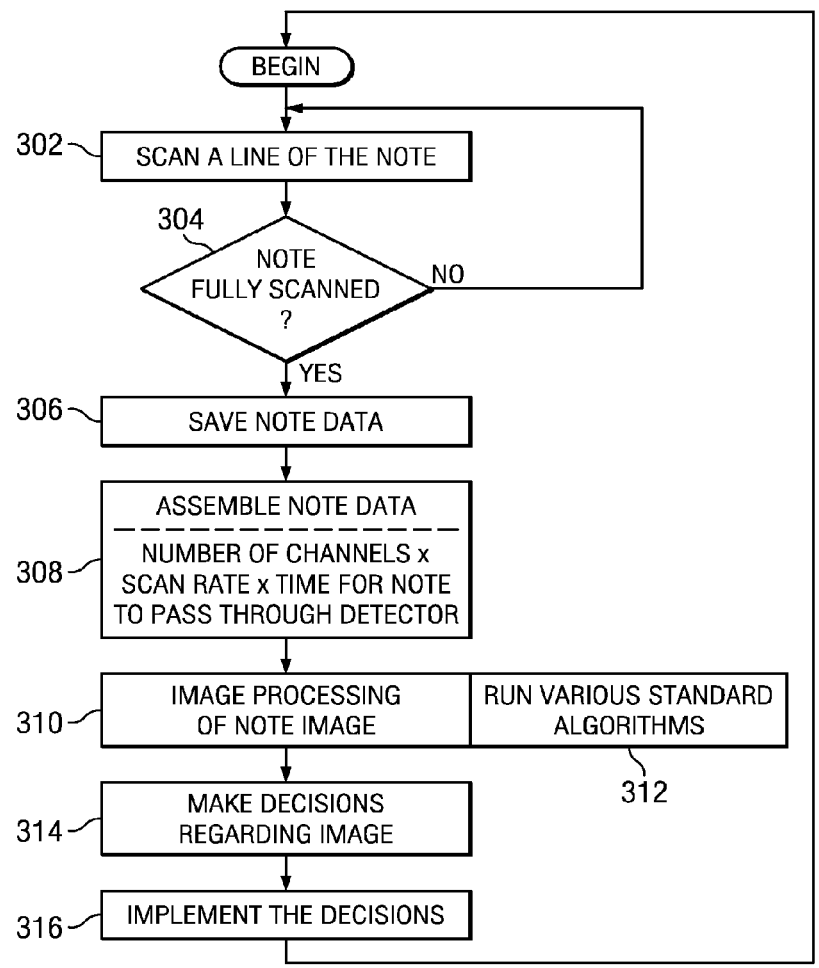
FIG. 3 is a flowchart representing the magnetoresistive detector device processing steps.

FIG. 3 provides a flow diagram of the processing steps taken to image the note. The bank note first enters the detector array and the MRD sensors are read to obtain a line scan as the note advances (302) until the note is fully scanned (304). Because the magnetoresistive detectors are passive and monitor changes in magnetic flux, the output of each detector channel in the sensor array is simultaneously monitored and captured such as with an analog to digital conversion circuitry. With multiple captures over a brief period of time (the time it takes for the note to pass the detector array), it is possible to capture a line scan image of the magnetic content of the note as representative magnetic pattern data.

Once the note is fully scanned, the note data is saved to system memory for further processing (306). This memory may comprise volatile storage, non-volatile storage, or a combination of the two. The amount of note data accumulated with a line scan of the note can be determined by multiplying the number of channels by the scan rate, and multiplying this value by the time it takes for the note to pass through the detector (308).

Once the magnetic pattern data is accumulated, image processing algorithms may be employed to construct a digital image representation of the surface of the bank note from the data obtained (310). This image may then be retained in a system database where other processing algorithms may be utilized (312) such as an algorithm that correlates the reconstructed image with various actual attributes of the scanned note to create a surface map of features. Other algorithms may compare the scanned bank note with a standard sample bank note for identification purposes or determination of wear, damage or alteration.

Once the note is fully processed and the image data is generated, decisions can be made concerning the note (314). For example, the system may consider print density or magnetic print distribution when determining whether a note should remain in circulation. The system may also extract magnetic features from the image data for comparison with a reference standard. The system then acts upon the decisions and handles the note accordingly (316).

In yet another embodiment, multiple such MRD arrays are present (204 and 402)—one on each side of the transport path. FIG. 4 depicts such a combination. As the note passes the two MRD arrays (208 and 404), a line scan of both the front and back of the note is performed and magnetic pattern data is obtained. As before, image processing algorithms may then reconstruct an image from the magnetic pattern data. The image may then be retained in a database where it may further be correlated with other attributes of the given note.

The invention may be embodied in other specific forms without departing from the spirit or essential characteristics thereof. The present embodiments are therefore to be considered in all respects as illustrative and not restrictive. Accordingly, the scope of the invention is established by the appended claims rather than by the foregoing description. All changes which come within the meaning and range of equivalency of the claims are therefore intended to be embraced therein. Further, the recitation of method steps does not denote a particular sequence for execution of the steps. Such method steps may therefore be performed in a sequence other than that recited unless the particular claim expressly states otherwise.

I claim:

1. A system for automatically detecting the magnetic features of a bank note, the system comprising:
    a transport device capable of transporting a bank note;
    a data processing device capable of executing stored program instructions;
    a data storage device operably coupled with the data processing device;
    a first detector device operably coupled with the data processing device, the first detector device comprising at least one magnetoresistive sensor positioned proximate the transport device and oriented so as to enable detection of the magnetic features of the adjacent surface of the passing bank note; wherein the data processing device is capable of executing stored program instructions comprising:
        reading the output of the first detector device to capture the magnetic pattern data of the adjacent surface of the passing bank note;
        storing the captured magnetic pattern data in the data storage device; and
        making a determination regarding final processing of the bank note based upon the magnetic pattern data; and
    a strapper, wherein the strapper straps a plurality of bank notes into a bundle.

2. The system of claim 1, the program instructions further comprising:
    creating a representative digital image of the detected surface of the bank note from the magnetic pattern data.

3. The system of claim 1 wherein the least one magnetoresistive sensor comprises a plurality of magnetoresistive sensors oriented in a linear array, the array positioned perpendicular to the direction of the travel of the bank note.

4. The system of claim 3 wherein the plurality of the magnetoresistive sensors spans the width of the passing bank note.

5. The system of claim 1 further comprising:
    a second detector device operably coupled with the data processing device, the second detector device comprising at least one magnetoresistive sensor, wherein the second detector device is positioned proximate the transport device on the side of the transport device opposite that of the first detector device and oriented so as to enable detection of the magnetic features of the surface of the passing bank note opposite that of the first detector device.

6. The system of claim 5, the program instructions comprising:
    reading the output of the first detector device to capture the magnetic pattern data of the surface of the passing bank note adjacent to the first detector device;
    storing the captured first side magnetic pattern data in the data storage device;
    reading the output of the second detector device to capture the magnetic pattern data of the surface of the passing bank note adjacent to the second detector device; and
    storing the captured second side magnetic pattern data in the data storage device.

7. The system of claim 6, the program instructions further comprising:
    creating a representative first digital image of the surface of the bank note from the first side magnetic pattern data; and
    creating a representative second digital image of the surface of the bank note from the second side magnetic pattern data.

8. The system of claim 7, the program instructions further comprising:
    making a determination regarding final processing of the bank note based upon either the first side magnetic pattern data or the second side magnetic pattern data.

9. The system of claim 5 wherein the at least one magnetoresistive sensor of the second detector device comprises a plurality of magnetoresistive sensors oriented in a linear array, the array positioned perpendicular to the direction of the travel of the bank note.

10. The system of claim 9 wherein the plurality of the magnetoresistive sensors of the second detector device spans the width of the passing bank note.

11. A method for detecting magnetic features of a bank note comprising:
    transporting the bank note proximate to a first at least one magnetoresistive sensor;
    reading the output from the first at least one magnetoresistive sensor as the note is adjacent thereto to obtain a first surface magnetic pattern data of the surface of the passing note adjacent to the at least one sensor;
    analyzing the first surface magnetic pattern data with a data processing device;
    processing the bank note based upon the analysis of the first surface magnetic pattern data; and
    bundling the bank note with a plurality of other bank notes using a strapper.

12. The method of claim 11 further comprising:
    processing the first surface magnetic pattern data with the data processing device to construct a representative digital image of the bank note.

13. The method of claim 11 further comprising:
determining the magnetic features present on the bank note by analyzing the first surface magnetic pattern data with the data processing device.

14. The method of claim 11 further comprising:
transporting the bank note proximate to a second at least one magnetoresistive detector;
reading the outputs from the second at least one magnetoresistive detector as the note is adjacent thereto to obtain second surface magnetic pattern data of the surface of the passing note adjacent to the detector;
analyzing the second surface magnetic pattern data with the data processing device; and
making a determination regarding final processing of the bank note based upon the first surface magnetic pattern data or the second surface magnetic pattern data.

15. The method of claim 14, further comprising:
processing the second surface magnetic pattern data with the data processing device to construct a representative digital image of the bank note.

16. The method of claim 14 further comprising:
determining the magnetic features present on the bank note by analyzing the second surface magnetic pattern data with the data processing device.

17. The method of claim 11 wherein the first at least one magnetoresistive sensor comprises a plurality of magnetoresistive sensors oriented in a linear array, the array positioned perpendicular to the direction of the travel of the bank note.

18. The method of claim 14 wherein the second at least one magnetoresistive sensor comprises a plurality of magnetoresistive sensors oriented in a linear array, the array positioned perpendicular to the direction of the travel of the bank note and opposite the first at least one magnetoresistive sensor.

19. The method of claim 11, wherein the bank note is a U.S. bank note.

20. The method of claim 19, wherein the U.S. bank note is a $20.00 bank note and wherein the magnetic features are selected from a group consisting of a magnetic ink and a magnetic strip of the U.S. bank note.

* * * * *